United States Patent [19]

Manitt et al.

[11] Patent Number: 4,931,323

[45] Date of Patent: Jun. 5, 1990

[54] THICK FILM COPPER CONDUCTOR PATTERNING BY LASER

[75] Inventors: James Manitt, Garland, Tex.; Scott Hull, San Gabriel, Calif.

[73] Assignee: Texas Instruments Incorporated, Dallas, Tex.

[21] Appl. No.: 256,148

[22] Filed: Oct. 6, 1988

Related U.S. Application Data

[62] Division of Ser. No. 130,903, Dec. 10, 1987.

[51] Int. Cl.$^5$ .......................... B05D 1/12; B05D 7/04
[52] U.S. Cl. ...................................... 427/53.1; 427/96
[58] Field of Search ............. 427/53.1, 96, 123, 126.2

[56] References Cited

U.S. PATENT DOCUMENTS

| | | | |
|---|---|---|---|
| 4,212,900 | 7/1980 | Serlin | 427/53.1 |
| 4,340,654 | 7/1982 | Campi | 427/53.1 |
| 4,504,339 | 3/1985 | Kamehara et al. | 427/96 |
| 4,508,753 | 4/1985 | Stepan | 427/53.1 |
| 4,526,807 | 7/1985 | Auerbach | 427/96 |
| 4,532,191 | 7/1985 | Humphries et al. | 427/53.1 X |
| 4,539,222 | 9/1985 | Anderson et al. | 427/96 |
| 4,578,329 | 3/1986 | Holsappel | 427/53.1 X |
| 4,627,160 | 12/1986 | Herron et al. | 427/96 |
| 4,681,778 | 7/1987 | Young | 427/53.1 |
| 4,795,512 | 1/1989 | Nakatani et al. | 427/96 |
| 4,801,351 | 1/1989 | Piwczyk | 427/53.1 |

*Primary Examiner*—Willard Hoag
*Attorney, Agent, or Firm*—René E. Grossman; Melvin Sharp

[57] ABSTRACT

This invention discloses a method of forming a conductor on a copper conductor on a semiconductor interconnection surface. A paste of copper material is formed over at least a portion of the semiconductor interconnection surface. A laser beam is directed against the paste. The laser beam is moved along the paste in accordance with a pattern to define the conductor. The laser beam fires and sinters the paste to form the conductor. The remaining paste which remains unfired is removed. The surface and the fired paste is then maintained in an inert atmosphere while heated to a sufficient temperature to provide a high quality copper conductor on the surface.

20 Claims, 1 Drawing Sheet

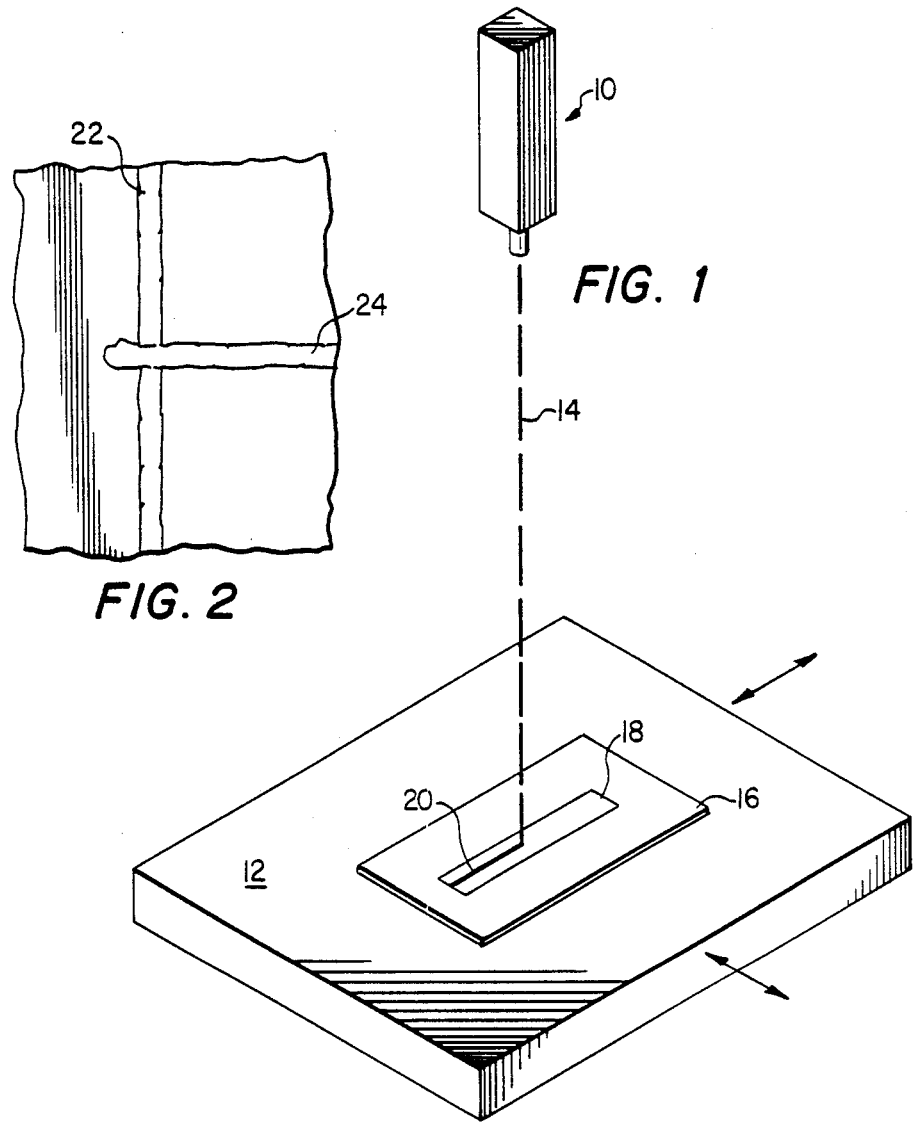

THICK FILM COPPER CONDUCTOR PATTERNING BY LASER

This application is a division of application Ser. No. 07/130,903, filed 12/10/87.

TECHNICAL FIELD OF THE INVENTION

This invention relates to the forming of metal conductors, and more particularly relates to the formation of narrow metal conductors for use on semiconductor integrated circuits.

BACKGROUND OF THE INVENTION

Hybrid circuits are commonly fabricated by thick film techniques in semiconductor integrated circuit technology. Thick film is often used because it is relatively economical, easy to process and requires less capital investment than thin film technologies. Thick film also allowed circuits to be built on multiple layers for higher densities.

Current thick film processing includes screen printing a thick film paste onto a ceramic substrate. The substrate is then dried and fired in order to sinter the paste. Although this technique is sufficient for many applications, current circuit density on multilayered hybrid circuits is restricted by the resolution available through conventional screen printing. Generally, state of the art screen printing line resolution is 0.005 inches, which is not satisfactory for new technologies which will require 0.002 to 0.003 inch resolution. Thin film processes allow high resolution, but are generally limited to single layer circuitry, and are relatively expensive and time consuming.

Lasers have been heretofore proposed for conductor formation in thick film circuits. For example, the article entitled "New Thick Film Multilayer Interconnection Technology Using a Nd-YAG Laser" by Ohsaki et al., 1982, IEEE, defines the use of a laser to heat gold conductor paste to form gold conductors in a thick film circuit. However, a need has arisen for a technique to form and pattern very thin copper conductors in thick film integrated circuits, as copper is much less expensive than gold and permits better rework with solder.

SUMMARY OF THE INVENTION

In accordance with the present invention, a method is provided for forming a conductor on a semiconductor device surface which includes forming a layer of unfired conductive paste over the device surface. A beam of coherent radiant energy is moved along a pattern on the layer of unfired conductive paste to sinter portions of the layer to define the configuration of the conductor. The remainder of the conductive paste is then removed and heat is applied to the surface and to the remaining conductive material in an inert atmosphere.

In accordance with another aspect of the invention, a method is provided to form a copper conductor on a semiconductor device surface. Paste of copper material is applied over at least a portion of the semiconductor device surface. A laser beam is directed against the paste and is moved along the paste in accordance with a pattern to define the conductor. The laser beam fires the paste to form a conductor as it is moved. The remaining paste which remains unfired is removed. The remaining fired paste is maintained in an inert atmosphere while heat is applied which is sufficient to provide a high quality copper conductor on the semiconductor device surface.

BRIEF DESCRIPTION OF THE DRAWINGS

For a more complete understanding of the present invention and for further advantages thereof, reference is now made to the following Detailed Description taken in conjunction with the accompanying Drawings in which:

FIG. 1 schematically illustrates a laser system for forming thick film copper lines in accordance with the invention; and FIG. 2 illustrates a top view of a typical copper line formed in accordance with the invention.

DETAILED DESCRIPTION OF THE INVENTION

FIG. 1 illustrates a system for performing the present invention. A laser source 10 is precisely mounted over a table 12 which can be accurately moved in x-y direction in the selected plane. Beam expanders, reflecting mirrors and focusing lens, not shown, may be used to accurately direct the coherent radiation energy laser beam 14 to selected locations on the table 12. Laser source 10 may comprise for example an Nd-YAG laser such as the Quantronix 603 LaserScribe. The power density of the laser will be varied for particular applications, but the typical power density may range from 2.5 to $20 \times 10^4$ watts/cm$^2$ with a laser beam diameter of 0.0025 inch as an example. The rate of movement of the table 12 may also be varied for different applications, but typical rates may range from 1.5 to 38 cm/sec.

A substrate or board 16 is positioned on table 12 and may comprise for example a ceramic board upon which it is desired to form a plurality of thin metal conductors in order to package one or more semiconductor devices thereon. Alternatively, the board 16 may comprise an alumina substrate, and any other substrate used in semiconductor packaging.

In accordance with the invention, a thick film conductor paste, such as DuPont 9924 copper paste, is printed on the board 16 in a pattern 18. Typical copper paste is made up of a ceramic base, metal particles and organic binder. The paste is then dried at 125° C. to remove solvents from the thick film paste. The paste forming the pattern 18 may be printed on with 0.75 mil in thickness. In some cases, the pattern 18 may comprise essentially the entire upper surface of the board 16.

Laser 10 is energized to direct the laser beam 14 against the defined location in the pattern 18. The table 12 is then very accurately moved such that the laser beam 14 traces the desired conductor line 20 along the pattern 18. A typical width of the conductor line 20 is 0.002 inches. The laser 14 sinters or fires the paste. During firing of the paste by the laser beam 14, the ceramic base adheres to the substrate, the metal particles congregate to form a conductor and the organic binder burns off.

The pattern 18 is then subjected to a washing step with organic solvent, such that the unfired conductive paste is removed, leaving only the fired conductor line 20. Any suitable known organic solvent such as alcohol or acetone may be used to perform the washing step.

An important aspect to the present invention is that the board 16 is then placed in an inert atmosphere and heated to a sufficient temperature to complete the formation of the copper conductor. Without proper furnace firing, the copper conductor may not be fully adhered to the board. When the device is heated in an inert atmosphere such as nitrogen to approximately 900° C., it has been found that conductive copper lines of very good quality are permanently formed on the surface of the board 16.

The mechanism of the formation of improved copper conductors in accordance with the invention is not fully understood. A theory has been proposed that copper oxide within the conductor partially disassociates and may tend to segregate into a thinner film, or it may be that the inert nitrogen atmosphere contains sufficient impurities to function as a reducing atmosphere by the introduction of a slight amount of hydrocarbon.

In has been shown that the final firing of the present device in a conventional nitrogen belt furnace to a temperature of 900° C. provides copper conductors of high quality on a ceramic board 16. The narrow copper conductor width made possible by the present invention allows very high density technology to be used. In addition to decreasing the space need for circuit conductors on a substrate, the present technique is useful in "partial board" technology. High density areas such as "flip chip" copper pads may be laser fired and connected to screen printed lines. In this manner, a designer may retain the high reliability of screen printed lines while also achieving the necessary narrow lines near the chip.

FIG. 2 illustrates a magnified top view of copper conductors 22 and 24 formed with the present invention. It will be seen that due to the very narrow dimensions, the intersecting copper conductors 22 and 24 are not absolutely in perfect in line execution. However, the lines in practice are of sufficient integrity to provide high reliability conductors suitable for use with semiconductor device mounting.

It will be understood that the system shown in FIG. 1 may be associated with conventional video alignment systems in conjunction with the laser 10 so that very precise alignment of the conductors 22 and 24 may be provided. This precise alignment can eliminate disadvantages in prior thick film printing techniques wherein it is difficult to align adjacent thick film layers due to opaque dielectric material between layers.

Although the present invention has been described with respect to a specific preferred embodiment thereof, various changes and modifications may be suggested to one skilled in the art and it is intended that the present invention encompass such changes and modifications as fall within the scope of the appended claims.

What is claimed is:

1. A method of forming an electrical conductor on a device surface comprising the steps of:
   (a) providing an unfired electrically conductive material;
   forming a layer of said unfired electrically conductive material over the device surface;
   (b) moving a beam of coherent radiant energy along a predetermined path on said layer of unfired electrically conductive material to fire the portions of said layer along said predetermined path to define the configuration of said electrical conductor;
   (c) removing the remainder of said electrically conductive material which remains unfired; and
   (d) applying sufficient heat to said surface and said fired electrically conductive material in an inert atmosphere to complete the formation of said electrical conductor and provide adherence of said electrical conductor to said device surface along said predetermined path.

2. The method of claim 1, wherein said beam of coherent radiant energy comprises a laser beam.

3. The method of claim 1, wherein said step of removing comprises washing said conductive material with liquid which tends to dissolve said unfired conductive material.

4. The method of claim 1, wherein said applied heat is at a temperature of about 900 degrees C.

5. The method of claim 1, wherein said heat is applied in an inert atmosphere containing nitrogen.

6. The method of claim 1, wherein said unfired electrically conductive material comprises copper paste formed of copper particles, a ceramic base and an organic binder.

7. The method of claim 6, wherein said applied heat is at a temperature of about 900 degrees C.

8. The method of claim 6, wherein said device surface is formed of ceramic material.

9. The method of claim 8, wherein said applied heat is at a temperature of about 900 degrees C.

10. A method of forming a copper electrical conductor on an interconnection surface suitable for connection to a semiconductor device comprising the steps of:
    (a) providing a paste of copper containing material;
    applying said paste of copper containing material over at least a portion of said interconnection surface;
    (b) providing a laser beam;
    (c) moving said laser beam along said paste in accordance with a predetermined pattern to define said electrical conductor along said pattern on said surface by said laser beam firing said paste along said pattern to form said conductor;
    (d) removing the remaining paste from said surface which remains unfired;
    (e) placing said surface and the remaining fired paste thereon in an inert atmosphere; and
    (f) applying heat to said remaining fired paste and said surface sufficient to provide a high quality copper conductor on the interconnection surface and provide adherence of said copper conductor to said surface along said pattern.

11. The method of claim 10, wherein said step of removing comprises washing said conductive material with liquid which tends to dissolve said unfired conductive material.

12. The method of claim 10, wherein said heat is applied in an inert atmosphere containing nitrogen.

13. The method of claim 10, wherein said surface is formed of ceramic material.

14. The method of claim 10, wherein said paste of copper material comprises copper particles, a ceramic base and an organic binder.

15. The method of claim 10, wherein said applied heat is at a temperature of about 900 degrees C.

16. The method of claim 15, wherein said paste of copper material comprises copper particles, a ceramic base and an organic binder.

17. The method of claim 15, wherein said surface is formed of ceramic material.

18. The method of claim 17, wherein said paste of copper material comprises copper particles, a ceramic base and an organic binder.

19. A method of forming a copper electrical conductor on an interconnection surface suitable for connection to a semiconductor device comprising the steps of:

(a) providing a paste of copper particles, a ceramic base and an organic binder;
(b) providing a ceramic interconnection surface;
(c) applying said paste over at least a portion of said interconnection surface;
(d) providing a laser beam;
(e) forming an electrical conductor along a predetermined pattern on said paste by moving said laser beam along said paste in accordance with said predetermined pattern to fire said paste along said pattern;
(f) removing the remaining paste from said surface which remains unfired;
(g) placing said surface and the remaining fired paste thereon in an inert atmosphere; and
(h) causing said conductor to adhere to said surface by applying heat to said remaining fired paste and said surface sufficient to provide a high quality copper conductor on the interconnection surface and provide adherence of said copper conductor to said surface along said pattern.

20. The method of claim 19, wherein said applied heat is at a temperature of about 900 degrees C.

* * * * *